10/23/79 OR 4,172,253

United States Patent [19]

Hermans

[11] 4,172,253

[45] Oct. 23, 1979

[54] CONTROLLED WAVE PATTERN ULTRASONIC BURGLAR ALARM

[76] Inventor: Albert L. Hermans, 2255 Bancroft Ave., San Leandro, Calif. 94577

[21] Appl. No.: 395,355

[22] Filed: Sep. 7, 1973

Related U.S. Application Data

[62] Division of Ser. No. 245,535, Apr. 19, 1972, Pat. No. 3,781,859.

[51] Int. Cl.² .......... H01L 41/10

[52] U.S. Cl. .......... 367/94; 310/317; 310/319; 310/324

[58] Field of Search .......... 179/110 A, 115 R; 340/559, 560; 310/321, 322, 324, 316–319

[56] References Cited

U.S. PATENT DOCUMENTS

| | | | |
|---|---|---|---|
| 3,331,970 | 7/1967 | Dundon et al. | 310/324 |
| 3,578,995 | 5/1971 | Massa | 310/324 X |
| 3,578,995 | 5/1971 | Massa | 310/8.2 X |
| 3,708,702 | 1/1973 | Brunnert et al. | 179/110 A X |
| 3,736,632 | 6/1973 | Barrow | 310/8.2 X |
| 3,749,854 | 7/1973 | Mifune | 310/8.2 X |
| 3,761,956 | 9/1973 | Takahashi et al. | 310/8.2 |
| 3,815,129 | 6/1974 | Sweany | 310/324 X |
| 3,912,952 | 10/1975 | Kumon et al. | 310/324 X |

*Primary Examiner*—Mark O. Budd

[57] ABSTRACT

A burglar alarm employs ultrasonic sound to protect a plurality of rooms. Each protected room contains a transmitter which emits an ultrasonic signal in a controlled wave pattern. The signal is received, filtered, and detected to determine if a doppler shift in the ultrasonic signal of a particular amplitude and frequency characteristic of human movement is present. If so, an alarm is given.

3 Claims, 7 Drawing Figures

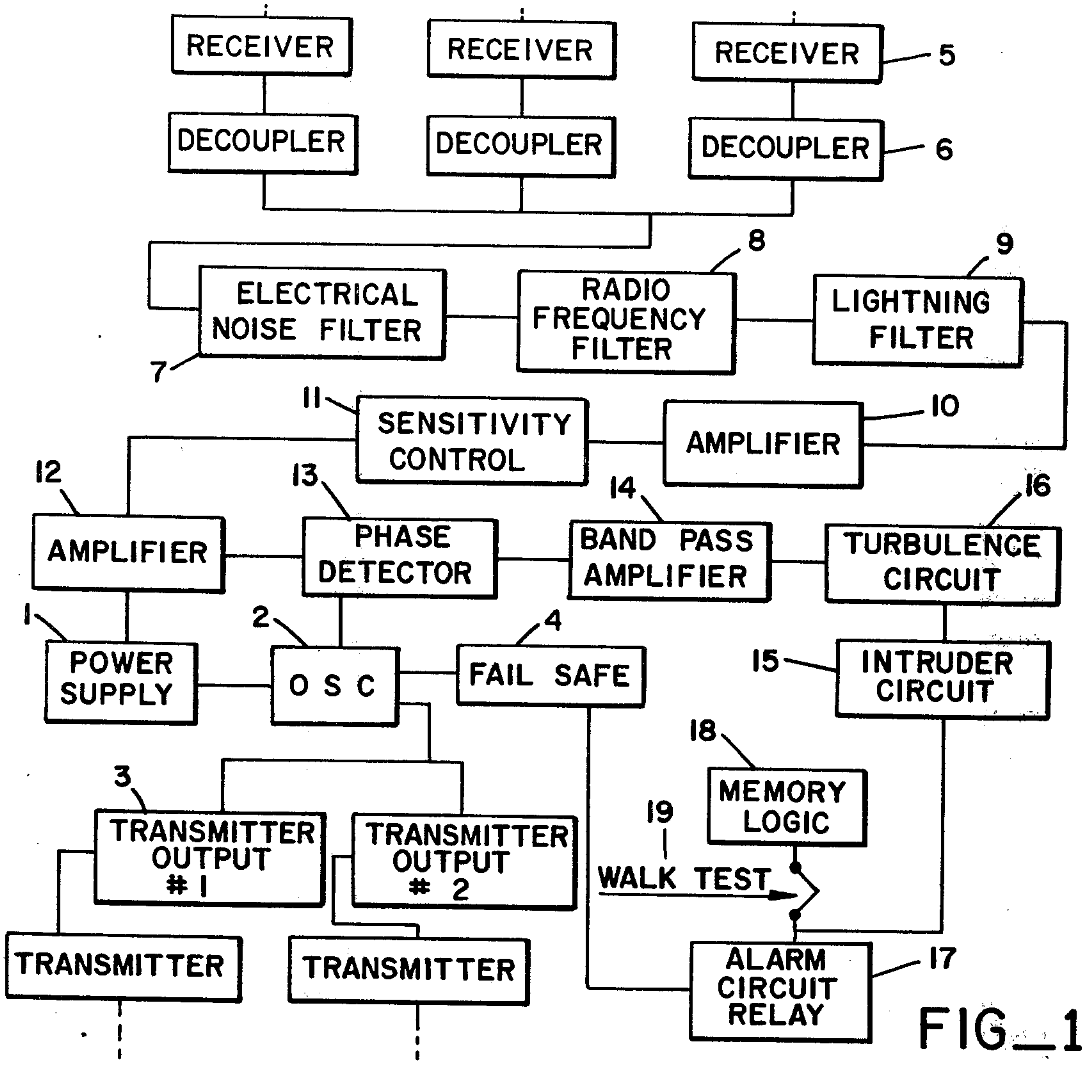
FIG_1
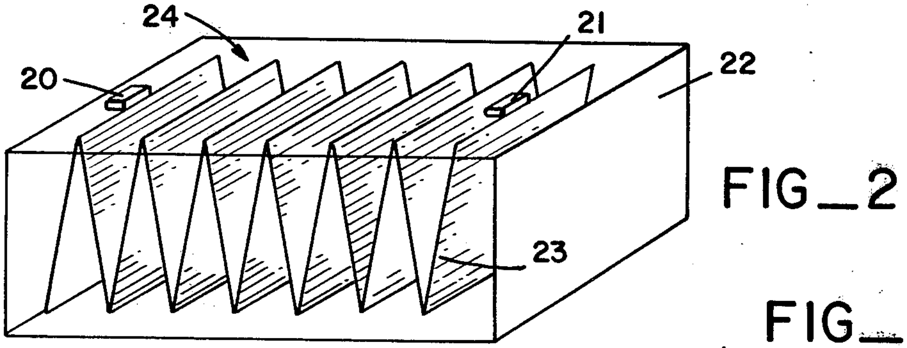
FIG_2
FIG_3
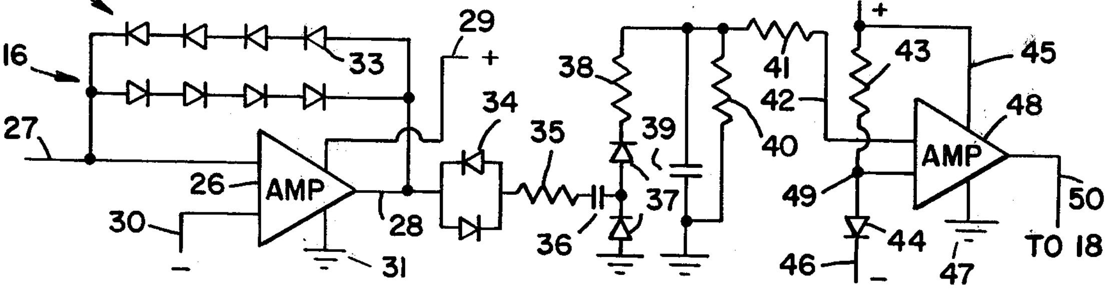

CONTROLLED WAVE PATTERN ULTRASONIC BURGLAR ALARM

CROSS-REFERENCE TO RELATED APPLICATION

This application is a division of my application Ser. No. 245,535, filed Apr. 19, 1972, now U.S. Pat. No. 3,781,859, dated Dec. 25, 1973.

BACKGROUND OF THE INVENTION

Many burglar alarm systems have attempted to use ultrasonic sound to detect unauthorized intrusion, but have met with only qualified success. In attempting to maximize sensitivity to human intrusion, these systems have been too susceptible to false alarms, rendering them commercially undesirable. These false alarms are usually caused by electrical interference from power lines, electrical equipment, etc., and particularly in the case of ultrasonic alarms, to random background noise such as jet planes, auto traffic, etc., and to non-intrusive movement, such as air turbulence, hanging decorations, draperies and the like.

Another problem encountered by former ultrasonic systems was the difficulty, and therefore high cost, of installation. This was due to the unbalancing of the central alarm system as new rooms were added to the system requiring repetitive rebalancing of each room receiver with the central system as installation progressed.

it is therefore an object of this invention to provide an ultrasonic burglar alarm system which optimally is sensitive to intrusion while giving no false alarms.

It is another object of this invention to employ a controlled wave pattern of ultrasonic radiation in an ultrasonic burglar alarm to increase the sensitivity of the alarm system.

It is a further object of this invention to provide an ultrasonic burglar alarm system which is simple and inexpensive to install and maintain.

It is a further object of this invention to provide an ultrasonic burglar alarm which employs transducers which are not affected by air turbulence.

THE DRAWING

FIG. 1 is a block diagram of the circuitry of the present invention.

2 is a representation of the controlled wave pattern of ultrasonic sound employed in the present invention.

FIG. 3 is a schemtic diagram of the limiter amplifier section of the circuitry shown in FIG. 1.

DESCRIPTION OF THE PREFERRED EMBODIMENT

Figure 4:
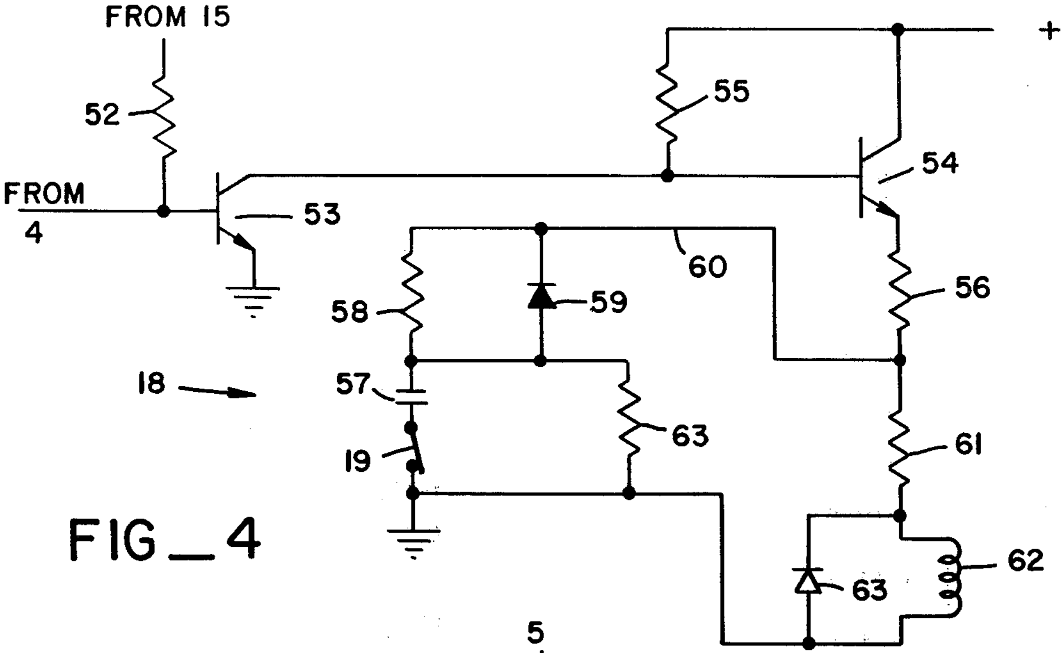
FIG. 4 is a schematic diagram of the memory logic section of the circuitry shown in FIG. 1.

The alarm system, shown in block diagram in FIG. 1, is powered by a regulated power supply 1, which includes a standby battery to provide power during a blackout and to defeat any attempt to unplug the system. The oscillator 2 generates an ultrasonic tone, at approximately 20,000 Hz, which is fed to the transmitting transducers 3 which are installed in the area to be protected. The oscillator signal is sampled by the fail safe circuit 4, which is connected to the alarm circuit relay 17. If the oscillator 2 should fail to operate, either through malfunction or an attempt to disrupt the system, the fail-safe circuit 4 will sense the diminished output of the oscillator 2, and will actuate the alarm circuit relay 17. The oscillator signal is also sampled by the phase detector 13.

Mounted in each protected area in association with each transmitting transducer 3 are the receiving transducer 5, connected to the system by high impedance decouplers 6. The receivers 5 receive the ultrasonic signal emitted by the transducers 3, and the received signal is passed through the decoupler 6 to the noise filters. The electrical noise filter 7, the radio frequency filter 8, and the lightning filter 9 remove extraneous noise which could cause a false alarm. The filtered signal then goes to the amplifier 10 and the sensitivity control 11. The sensitivity is adjusted to pass the maximum signal strength without causing a false alarm. The signal then goes to the amplifier 12, and the phase detector 13. The phase detector mixes the received signal with the sampled signal from the oscillator 2, and produces a doppler signal which is amplified by the band pass amplifier 14, which senses and amplifies a frequency component of approximately 35 Hz, produced by that of an intruder moving within the protected areas. The amplified doppler signal is then fed through the turbulence circuit 16 to the intruder circuit 15 which sends an alarm signal to the alarm circuit relay 17. The alarm signal is delayed, however, by the memory logic circuit 18, which receives the signal through the normally closed walk test switch 19. The memory logic 18 delays the alarm signal once for a short time, approximately one second, to provide a further safeguard against false alarms. The delay does not reset for a period of time, approximately one minute, so that a slow stepping burglar will still actuate the alarm. After the time delay, the alarm signal actuates the alarm relay 17 which operates an automatic police call, siren or other alarm device desired.

The schematic diagram of FIG. 3 shows the limiter amplifier and the level amplifier circuit that makes up the turbulence circuit 16, and the intruder circuit 15 of FIG. 1. Amplifier 26 receives the doppler signal through conductor 27, and puts out an amplified signal through conductor 28. Line 29 provides positive operating voltage, line 30 provides negative operating voltage, and line 31 is ground. Connected from line 27 to line 28 is a diode bridge 32 in a feedback arrangement. There are four series diodes in one direction in parallel with four diodes in the reverse direction. Each diode 33 has a forward breakdown voltage of 0.6 volts, so that the feedback effect takes place whenever the doppler signal is greater than $\pm 2.4$ volts. Thus all booming sounds picked up by the receivers 5 are limited in amplitude so that the large signals cannot blast their way through to the intruder circuit 15. The signal is then conducted by line 28 to the parallel back to back diodes 34.

Again each diode has a forward breakdown voltage of 0.6 volts. Thus, the first 0.6 volts of the doppler signal excursion in either the positive or negative direction is clipped eliminating the low voltage the low voltage component of the doppler signal which results from random background noise. The signal then goes through the limiting resistor 35 and the coupling capacitor 36, to the half wave rectifier 37. The rectifier 37 conducts the negative portion of the doppler signal to ground, and the remaining signal, lying between 0.6 and 2.4 volts, then passes through resistor 41 to conductor 42 and to the amplifier 48 which is part of the intruder circuit 15. A threshold level is formed by resistor 43 and diode 44 at conductor 49. When the D.C. level at conductor 42 exceeds the set level at conductor 49, amplifier 48 passes the signal to conductor 50 which is considered an alarm condition. The positive voltage for amplifier 48 is provided at line 45, negative voltage at 46 and ground at 47.

The intruder circuit 15 prevents false alarms due to falling objects or short wall or building movements due to earthquakes, sonic booms and the like, and provides an approximate delay of 0.15 seconds.

The circuit shown in FIG. 4 are the memory logic 18 and walk test 19 as shown in FIG. 1. It consists of transistor 53 biased normally off and transistor 54 biased normally on. Transistor 53 receives the alarm actuating signal from the fail safe circuit 4 or from the intruder circuit 15 through balancing resistor 52. When an alarm signal comes from intruder circuit 15 thorough conductor 50 of FIG. 3, it enters through resistor 52 of FIG. 4 to the base of transistor 53 which causes it to conduct. The bias voltage from resistor 55 which normally holds transistor 54 in the conducting condition is removed and transistor 54 stops conducting. Resistor 56 and resistor 61 in series with relay 62 are current limiting devices. When transistor 54 ceases to conduct, the voltage normally holding relay 62 engaged disappears and an alarm condition exists. However, after system has been set in the non-alarm condition for a period of 60 seconds current flowing through the conducting transistor 54 flows through resistor 56 to conductor 60 and through resistor 58 which charges capacitor 57 to full charge. When transistor 54 ceases to conduct, the current stored in capacitor 57 flows through diode 59 to conductor 60 through resistor 61 and holds relay 62 engaged for a period of approximately one second.

The resistor 63 in parallel with capacitor 57 is selected at random and changes the discharge time and charge time of the memory logic circuit so that no one will know the actual time delay of the circuit. The walk test jack switch 19 used during installation, opened by plugging in an installer's walk test device, opens the circuit at capacitor 57 from the circuit so that the relay will respond instantly when transistor 54 switches off.

The sensitivity adjustment and system balancing can be accomplished quickly and inexpensively.

Figure 5:
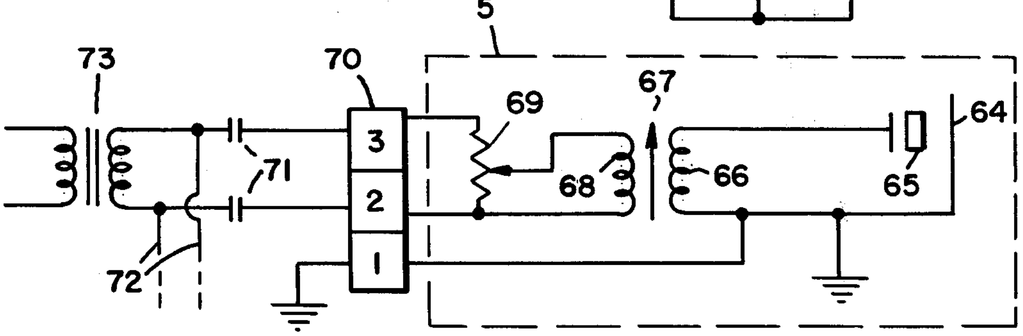
FIG. 5 is a schematic diagram of a receiver transducer and decoupler connected to the central alarm system.

The circuitry of FIG. 5 shows a schematic view of a receiver transducer 5 connected to the central alarm system. The receiver 5 consists of a tuned metal plate 64, which is tuned to the ultrasonic frequency at which the system operates. The plate receives this frequency from transmitter 3. A piezoelectric crystal 65, which is connected to the secondary winding 66 of the transformer 67, converts the received sound to electrical signals. The transformer 67 adjusts the reaction of the receiver circuit to provide optimum sensitivity at the operating frequency. The gain of the signal induced in the primary winding 68 is controlled by the variable resistor 69, which is a precision 20-turn potentiometer. The signal then goes through terminal block 70 to the decoupling capacitors 71. Conductors 72 connect to the two other decoupler inputs. Isolation transformer 73 isolates the three decoupler inputs from the electronics of the control unit and also works with the electrical noise filter circuit.

FIG. 2 shows a typical installation of a transmitting transducer 20 and a receiving transducer 21 in a small room 22, and the controlled wave pattern 23 that is used to detect intrusion. Both transducers 20 and 21 are directional, and are mounted on the ceiling 24 of the room 22 with their sensitive axes towards the floor. The transmitter 20 directs a wide beam of sound toward the floor, and that beam is reflected and re-reflected many times before being received by the receiver 21. It can be seen that there is no line of sight communication path between the transducers 20 and 21.

Therefore, decorations hanging from the ceiling and tall decorative plans moving in connection currents will now actuate the alarms. This is due to the fact that the controlled wave pattern system is mmuch more sensitive to sustained movement through the multireflected beam than to short movements directly between the transducers 20 and 21.

It should be noted that because of the low profile of the sound emitting tuned plate, the receiver 5 or transmitter 3 are not readily effected by air currents blowing against them. Also, with slight modification they can be flush mounted in any wall or ceiling, permitting an unobstructive and efficient installation.

The tuned plate 64 (of FIGS. 6 and 7) has a flat surface, making it economical to manufacture a true tuned ultrasonic emitting surface. When tuned electrically to its operating frequency the plate acts with a fly wheel effect making it possible to produce more ultrasonic energy more efficiently.

Figure 6:
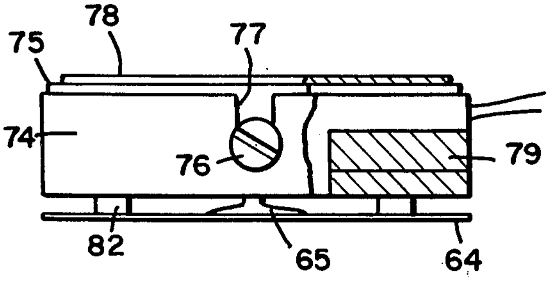
FIG. 6 is a partially cut-away side view of a receiver transducer.
Figure 7:
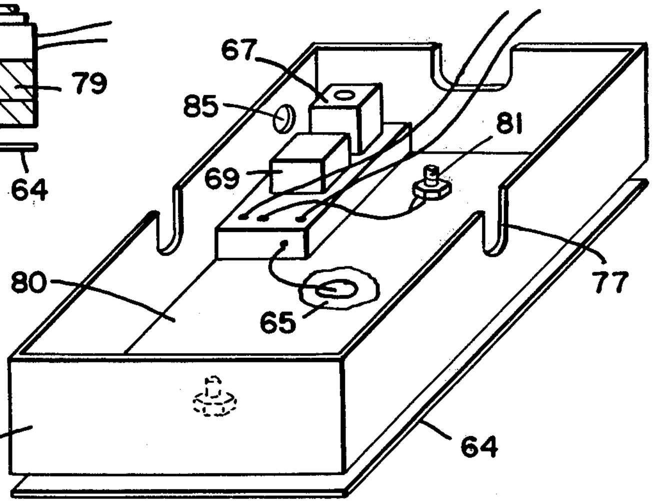
FIG. 7 is a perspective view of the receiver transducer of FIG. 6, shown with the top removed.

FIGS. 6 and 7 are views of receiver 5. The receiver 5 consists of a long rectangular metal or injection molded plastic box 74, with a cover 75 held on by screws 76 which fit through slots 77 of the box 74. The cover 75 has double-sided foam adhesive tape 78 applied to it, to facilitate easy installation to any smooth surface. In one corner of the box 74 is a small rectangular plastic box 79 in which the potentiometer 69 and the transformer 67 are imbedded in epoxy plastic. The hole 85 allows adjustment of the potentiometer 69 without removal of the cover 74.

The tuned plate 64 is attached to the box 74 by bolts 81, which extend through the bottom 80 of the box. The plate 64 is spaced apart from the box 74 by bushings 82. The crystal 65 is soldered and cemented to the tuned plate 64, to provide good electrical and mechanical union. The crystal 65 converts the vibrations of said plate 64 into electrical signals.

The transmitters 33 have the same outward appearance as the receivers 5. Each transmitter is housed in a box of the same dimensions as the box 74, and each employs the same tuned plate 64 — piezoelectric crystal 65 combination to emit the ultrasonic signal, the crystal 65 vibrating said tuned plate 64 to oscillate at the correct ultrasonic frequency. The transmitters 3, however, are not adjustable.

It should be noted that because of the low profile of the box 74, the receiver 5 or transmitter 3 are not readily affected by air currents blowing against them. Also, with slight modificaton they can be flush mounted, in any wall or ceiling, permitting an unobstructive and effective installation.

It should also be noted that there is ample room in the box 74 for a thermal switch, and therefore the box 74 could also house a fire sensor for a fire alarm system oprated in conjunction with the present burglar alarm system.

I claim:

1. In a burglar alarm system, a low-profile transducer for receiving an ultrasonic signal of predetermined frequency generated by a remote source, said transducer comprising a mounting means, a tuned plate having a characteristic resonant frequency equal to said predetermined frequency and vibrating at said frequency when said signal impinges upon said plate, said plate being spaced from said mounting means by spacer means, a piezoelectric crystal fastened to said plate to provide both electrical and mechanical union therebetween, said crystal vibrating in unison and sympathetically with said plate when said signal impinges upon said plate and thereby generating an electrical signal related to said ultrasonic signal for triggering an external alarm means, said crystal being electrically connected in parallel with the primary winding of a variable transformer, the secondary winding of said transformer being connected in parallel with a variable potentiometer for adjusting the sensitivity of said transformer, said mounting means comprising a rectangular frame means provided with at least one sot extending therethrough, at least one rectangular wall means extending generally normal from said frame means and fixedly attached thereto, said wall means being provided with at least one slot therein; a cover means fastened to said wall means by at least one fastener which extends through said slot in said wall means, one surface of said cover means being provided with a double-sided foam adhesive tape, said potentiometer and said transformer being fixedly fastened to said frame means by epoxy plastic, said potentiometer being adjustable without removal of said cover means via access through an aperture provided in said wall means, said tuned plate being fixedly attached to a lower surface of said frame means by fastener means which extend through at least one opening in said frame means, and said tuned plate being further spaced from said frame means lower surface by bushing means interposed therebetween.

2. In a burglar alarm system, a low-profile transducer for emitting a wide-beam ultrasonic signal of predetermined frequency comprising a counting means and a tuned plate having a characteristic resonant frequency equal to said predetermined frequency and vibrating said frequency when excited by excitation means comprising a piezoelectric crystal fastened to said plate to provide both electrical and mechanical union therebetween, said crystal being caused to vibrate at said frequency by an electrical signal related to said ultrasonic signal, said crystal thereby causing said plate to vibrate at said frequency in unison and sympathy with said crystal, said mounting means comprising a rectangular frame means provided with at least one slot extending therethrough, at least one rectangular wall means extending generally normally from said frame means and fixedly attached thereto, said wall means being provided with at least one slot therein, a cover means fastened to said wall means by at least one fastener which extends through said slot in said wall means, one surface of said cover means being provided with a double-sided foam adhesive tape, said tuned plate being fixedly attached to a lower surface of said frame means by fastener means which extend through at least one opening in said frame means, and said tuned plate being further spaced from said frame means lower surface by bushing means interposed therebetween.

3. An alarm device comprising a transducer for transmitting ultrasonic signals in an air environment for detection of intruding objects or persons therein, the transducer having a piezoelectric element coupled to a thin, flat, resonant plate substantially larger than said piezoelectric element, the plate having a periphery substantially free and unsupported during operation, said piezoelectric element being excitable at a resonant frequency of said plate when coupled to the piezoelectric element, and, means for detecting variations in ultrasonic signals in an air environment and activating an alarm.

* * * * *